(12) United States Patent
Choi

(10) Patent No.: US 12,317,652 B2
(45) Date of Patent: May 27, 2025

(54) SEMICONDUCTOR LIGHT-EMITTING ELEMENT AND DISPLAY DEVICE

(71) Applicant: LG ELECTRONICS INC., Seoul (KR)

(72) Inventor: Hwanjoon Choi, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 18/701,014

(22) PCT Filed: Oct. 15, 2021

(86) PCT No.: PCT/KR2021/014406
§ 371 (c)(1),
(2) Date: Apr. 12, 2024

(87) PCT Pub. No.: WO2023/063457
PCT Pub. Date: Apr. 20, 2023

(65) Prior Publication Data
US 2024/0413269 A1    Dec. 12, 2024

(51) Int. Cl.
*H10H 20/841*    (2025.01)
*H01L 25/075*    (2006.01)
*H10H 20/01*    (2025.01)

(52) U.S. Cl.
CPC ....... *H10H 20/841* (2025.01); *H01L 25/0753* (2013.01); *H10H 20/0363* (2025.01)

(58) Field of Classification Search
None
See application file for complete search history.

(56) References Cited

U.S. PATENT DOCUMENTS

2009/0108250 A1    4/2009    Kim et al.
2009/0294784 A1    12/2009    Nakahara et al.
(Continued)

FOREIGN PATENT DOCUMENTS

KR    10-2008-0065666 A    7/2008
KR    10-2009-0043057 A    5/2009
(Continued)

OTHER PUBLICATIONS

International Search Report, issued in PCT/KR2021/014406, PCT/ISA/210, dated Jul. 8, 2022.
(Continued)

*Primary Examiner* — Feifei Yeung Lopez
(74) *Attorney, Agent, or Firm* — Birch, Stewart, Kolasch & Birch, LLP

(57) ABSTRACT

This semiconductor light emitting device includes an emission layer, a passivation layer on the emission layer, and a first adhesive layer on the passivation layer. The passivation layer may include a plurality of grooves, and the first adhesive layer may be disposed in each of the plurality of grooves. Arranging the first adhesive layer in the plurality of grooves may enhance fixability. The display device includes a plurality of semiconductor light emitting devices. The semiconductor light emitting devices may include a horizontal semiconductor light emitting device, a flip chip semiconductor light emitting device, or a vertical semiconductor light emitting device.

16 Claims, 11 Drawing Sheets

(56) References Cited

U.S. PATENT DOCUMENTS

| | | | | |
|---|---|---|---|---|
| 2011/0284822 A1* | 11/2011 | Jung | ................ | H01L 33/56 |
| | | | | 257/E33.012 |
| 2016/0252671 A1* | 9/2016 | Jung | ................ | H10H 20/856 |
| | | | | 362/609 |
| 2018/0130926 A1* | 5/2018 | Huang | ................ | H01L 33/14 |
| 2019/0288163 A1 | 9/2019 | Choi et al. | | |
| 2020/0161499 A1 | 5/2020 | Ota et al. | | |
| 2021/0066388 A1 | 3/2021 | Kim | | |
| 2021/0111167 A1 | 4/2021 | Kang et al. | | |
| 2022/0310879 A1 | 9/2022 | Lee | | |
| 2022/0416127 A1 | 12/2022 | Choi et al. | | |

FOREIGN PATENT DOCUMENTS

| | | |
|---|---|---|
| KR | 10-2009-0117002 A | 11/2009 |
| KR | 10-2013-0007194 A | 1/2013 |
| KR | 10-2018-0065342 A | 6/2018 |
| KR | 10-2018-0102422 A | 9/2018 |
| KR | 10-2019-0022326 A | 3/2019 |
| KR | 10-2019-0077254 A | 7/2019 |
| KR | 10-2020-0026773 A | 3/2020 |
| KR | 10-2020-0057216 A | 5/2020 |
| KR | 10-2020-0104876 A | 9/2020 |
| KR | 10-2021-0043262 A | 4/2021 |

OTHER PUBLICATIONS

Written Opinion of the International Searching Authority, issued in PCT/KR2021/014406, PCT/ISA/237, dated Jul. 8, 2022.

* cited by examiner

[FIG. 1A]
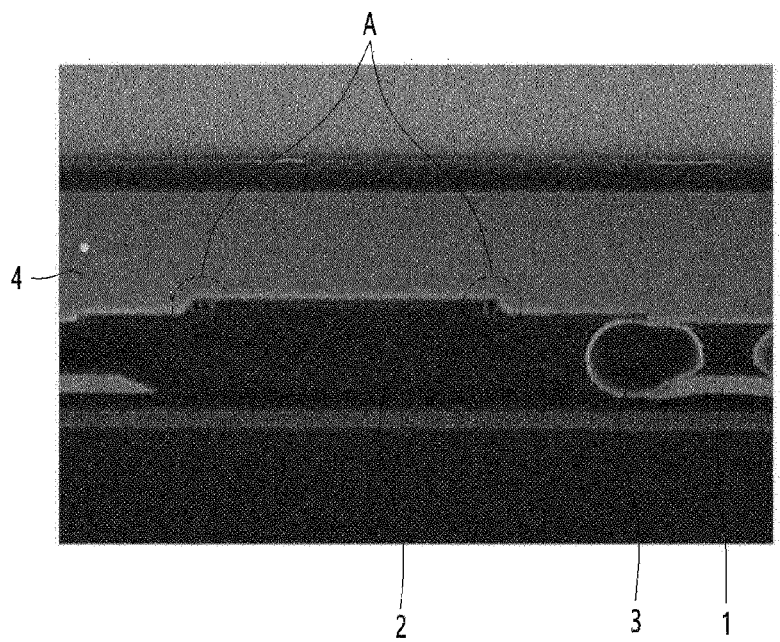
[FIG. 1B]
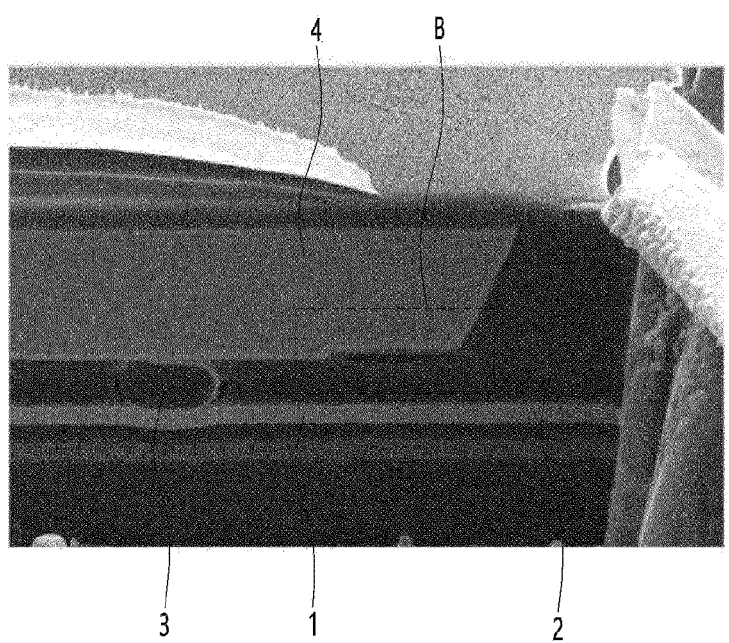

[FIG. 2]
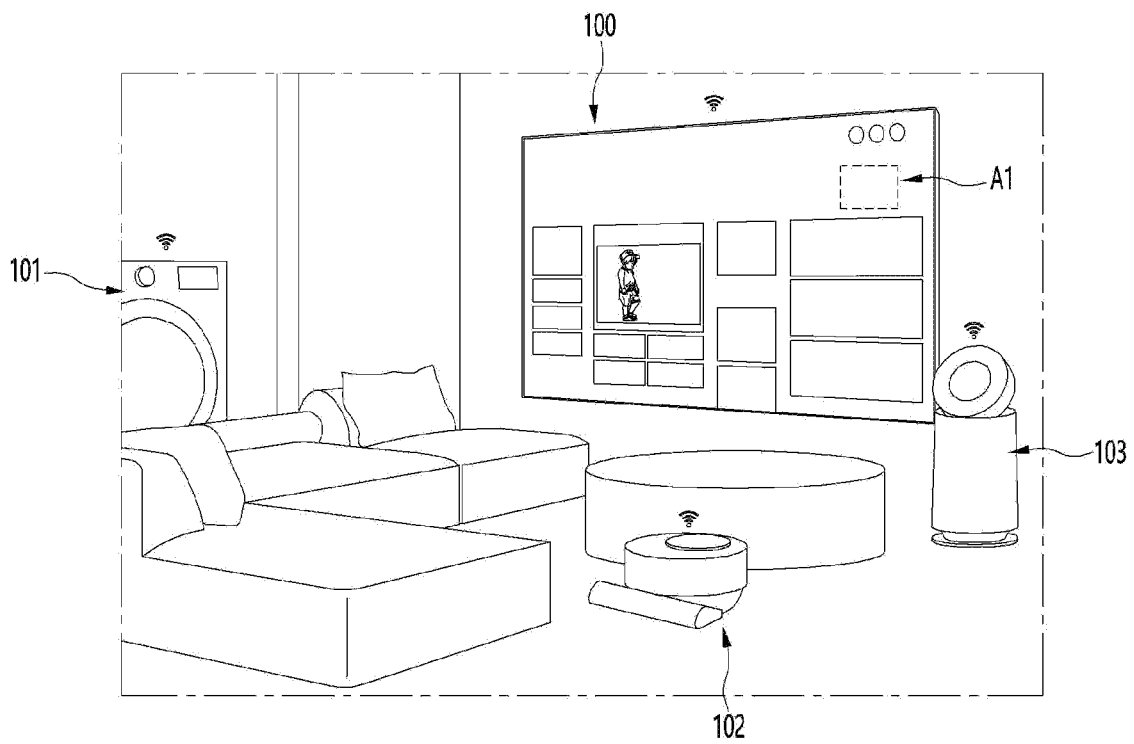

[FIG. 3]
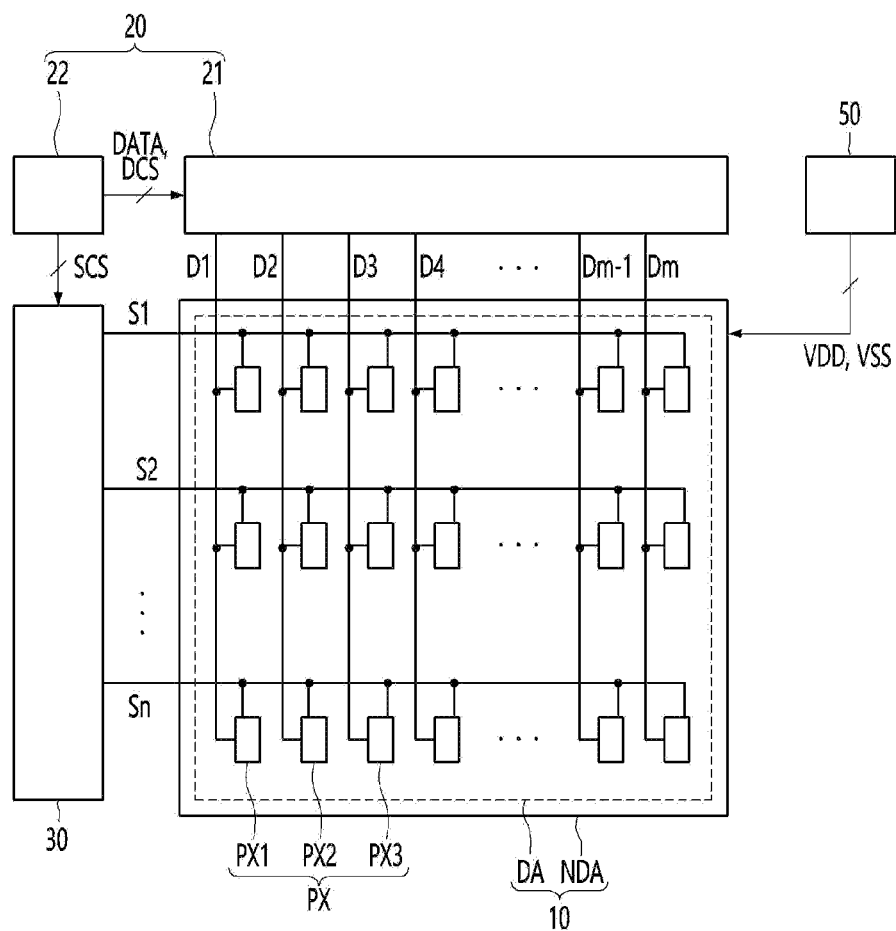

[FIG. 4]
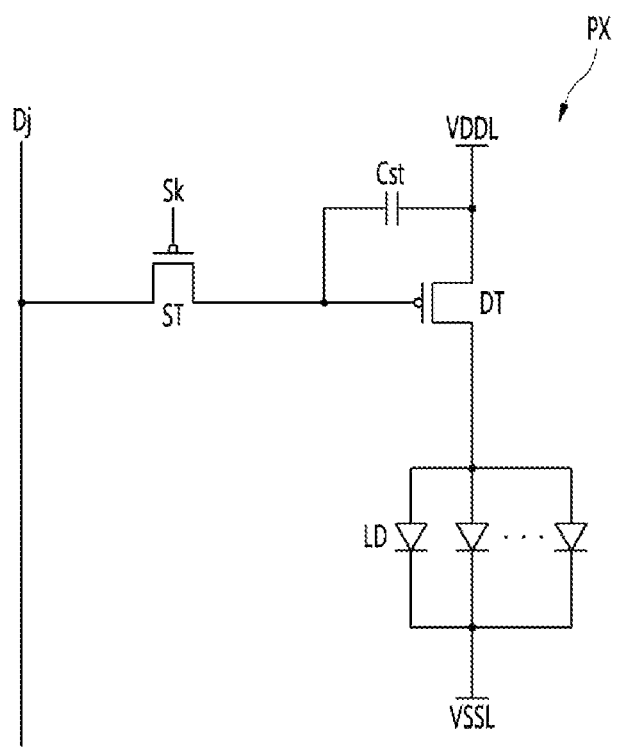

[FIG. 5]
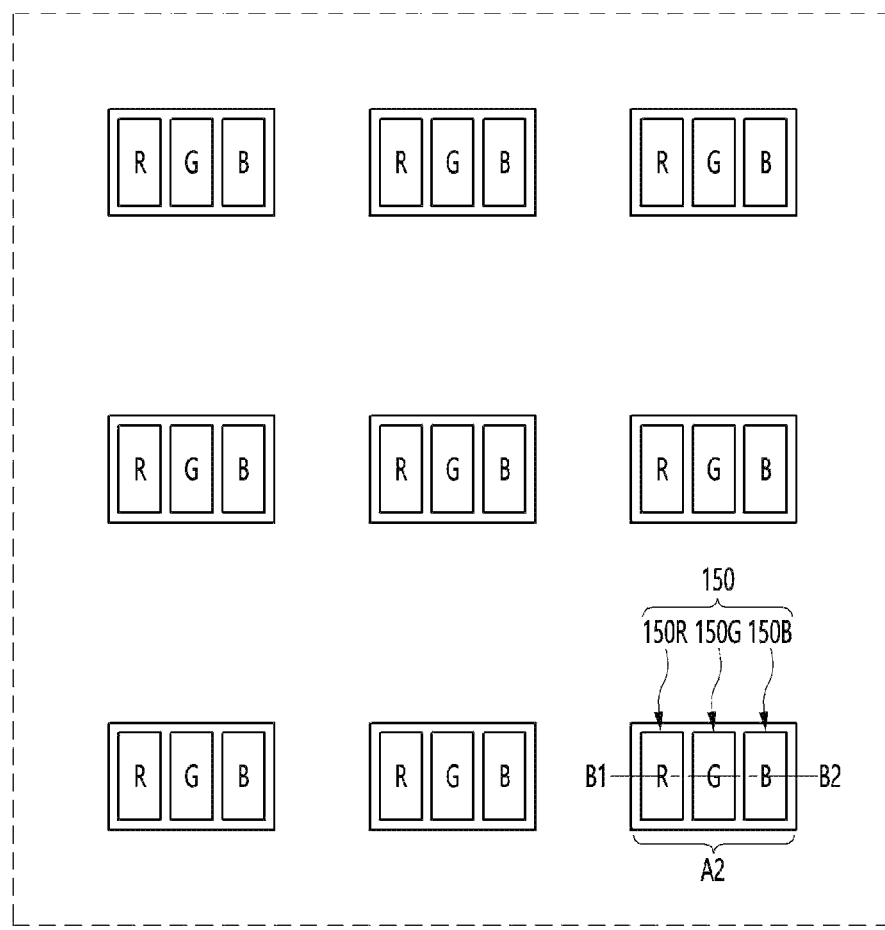

[FIG. 6]
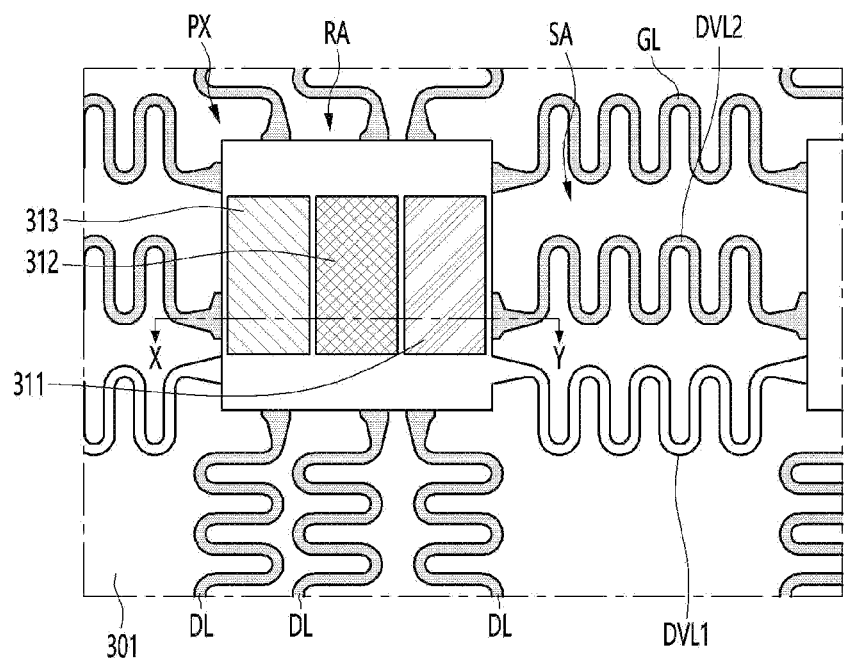
[FIG. 7]
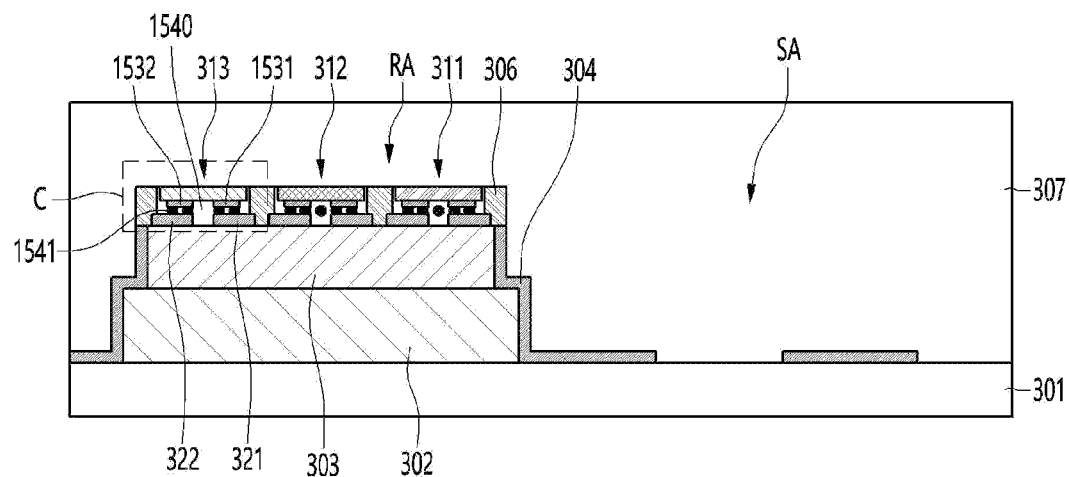

[FIG. 8]
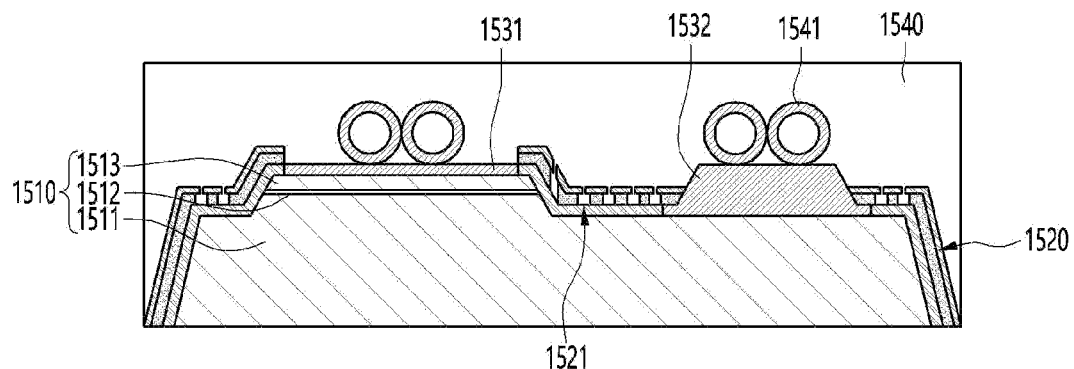
[FIG. 9]
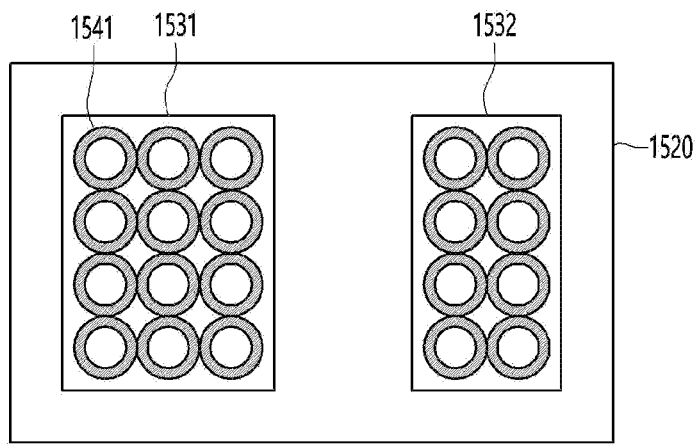
[FIG. 10]
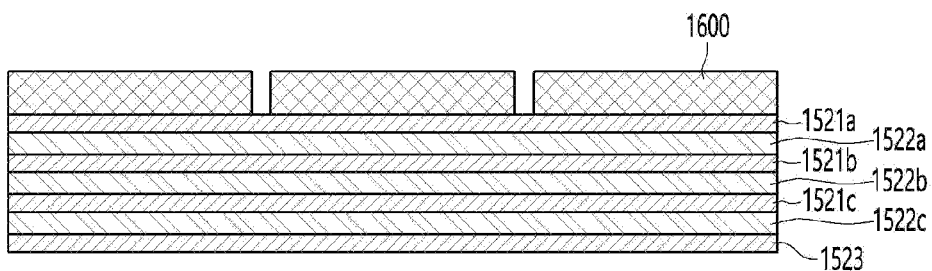

[FIG. 11]
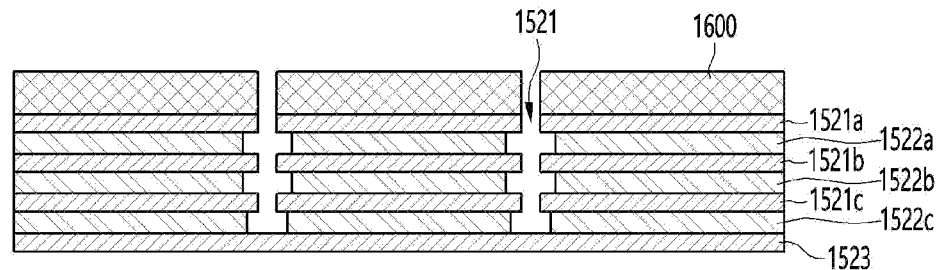
[FIG. 12]
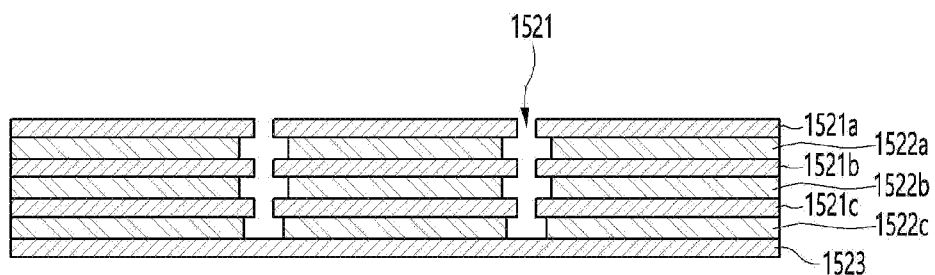
[FIG. 13]
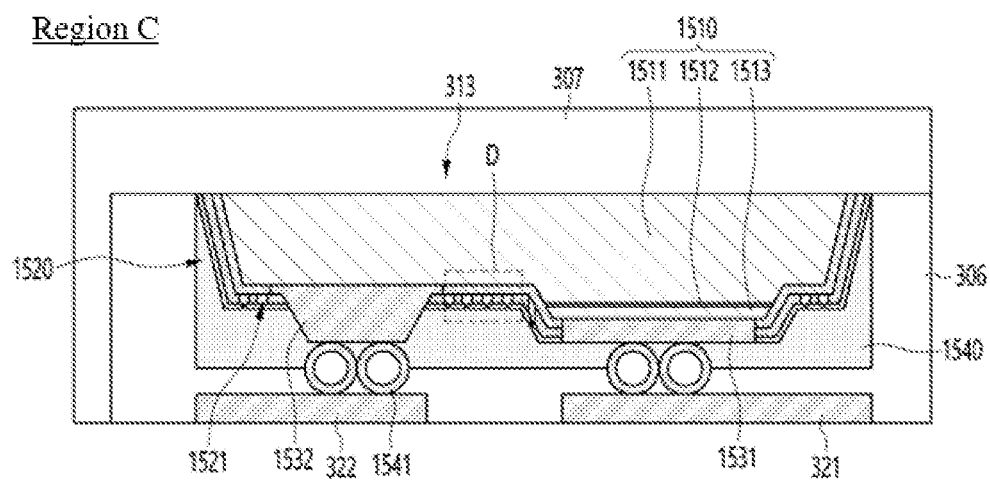

[FIG. 14]
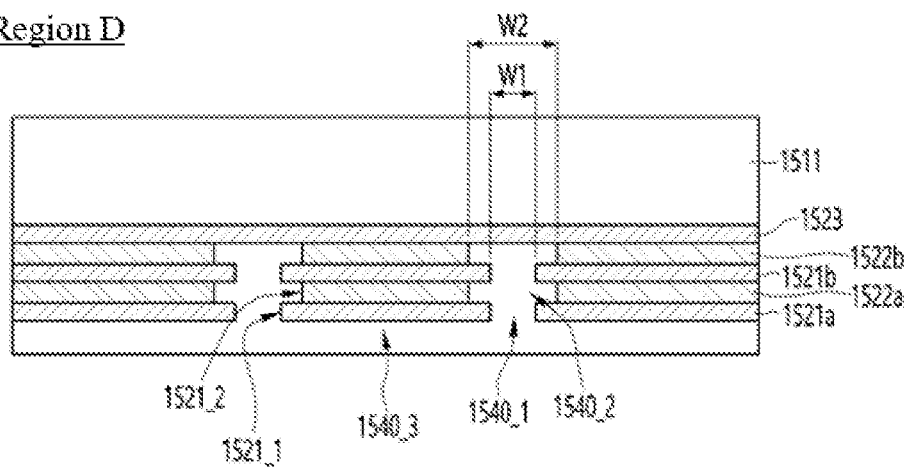
[FIG. 15]
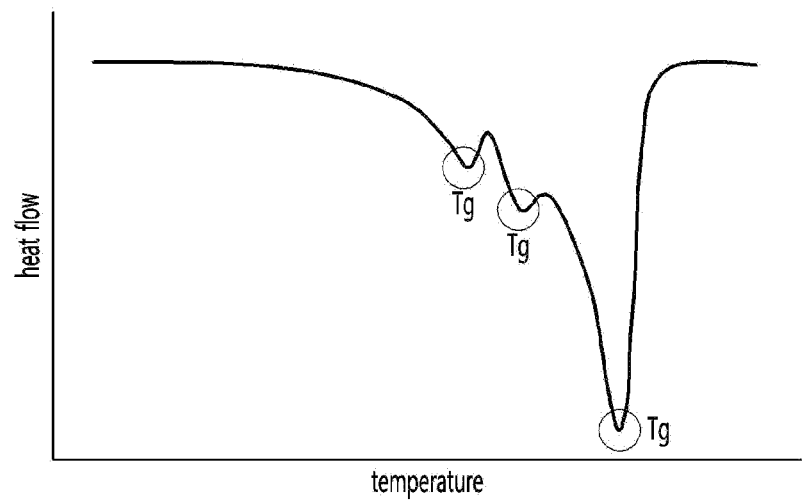

[FIG. 16]
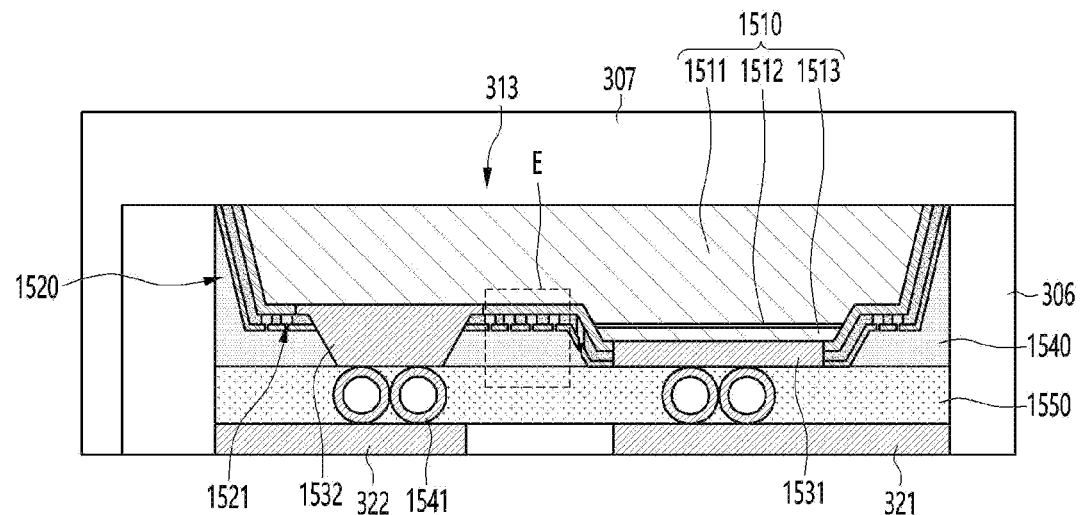
[FIG. 17]
Region E
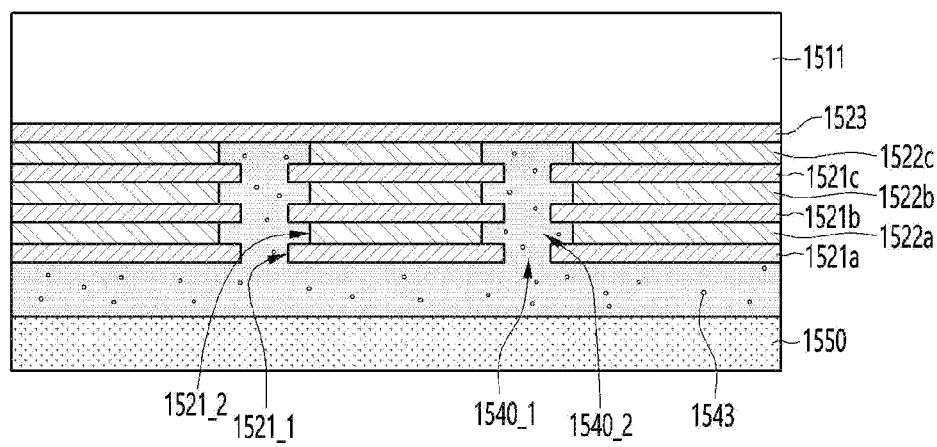

[FIG. 18]
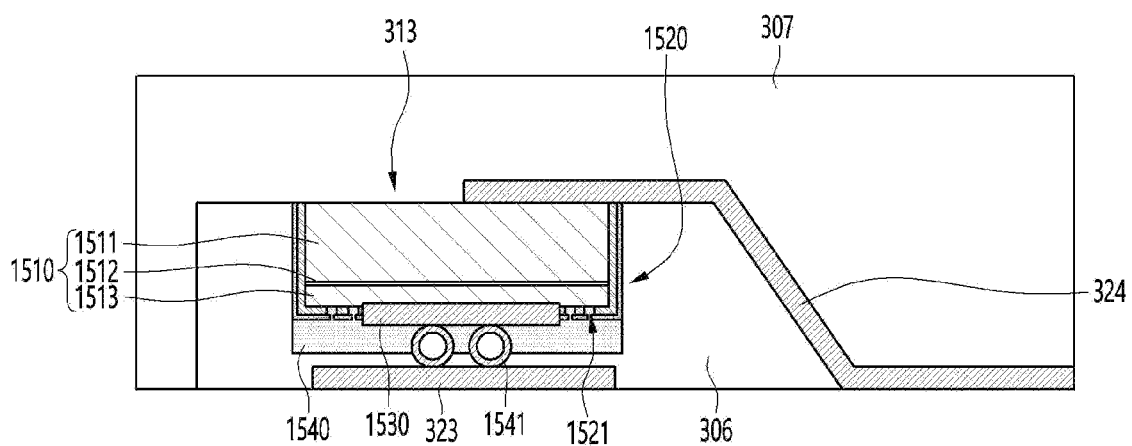

SEMICONDUCTOR LIGHT-EMITTING ELEMENT AND DISPLAY DEVICE

CROSS REFERENCE TO RELATED APPLICATIONS

This application is the National Phase of PCT/KR2021/014406 filed on Oct. 15, 2021, which is hereby expressly incorporated by reference into the present application.

TECHNICAL FIELD

The embodiment relates to a semiconductor light emitting device and a display device.

BACKGROUND ART

Display devices display high-definition images using self-luminous elements such as light emitting diodes as light sources for pixels. Light emitting diodes exhibit excellent durability even under harsh environmental conditions and are capable of long lifespan and high brightness, so light emitting diodes are attracting attention as a light source for next-generation display devices.

Recently, research is underway to manufacture ultra-small light emitting diodes using highly reliable inorganic crystal structure materials, place them on panels of display devices (hereinafter referred to as "display panels"), and use them as next-generation light sources.

These display devices are expanding beyond flat displays into various forms such as flexible displays, foldable displays, stretchable displays, and rollable displays.

In order to realize high resolution, the size of the pixels is gradually becoming smaller, and the light emitting devices are to be aligned in numerous pixels of this smaller size, so that research into the manufacture of ultra-small light emitting diodes as small as micro or nano scale is being actively conducted.

Display devices typically contain tens of millions of pixels or more. Therefore, because it is very difficult to bond at least one light emitting device to each of tens of millions of small pixels on a display panel, various studies on methods for bonding light emitting devices to a display panel have been actively conducted recently.

For example, a bonding member is formed in the entire area of the display substrate, and tens of millions of light emitting devices are bonded to the display substrate using the bonding member.

In this case, the bonding member is formed not only in the area corresponding to the light emitting device that requires the bonding member, but also in the area where the bonding member is not required, so material costs may be wasted.

Additionally, an electrical short may occur between adjacent light emitting devices due to a bonding member formed in an area that does not correspond to a light emitting device.

Meanwhile, a plurality of light emitting devices are bonded to the display substrate through a bonding member through a thermocompression method. That is, heat is applied to the bonding member to melt it, and pressure is applied to the plurality of light emitting devices to electrically connect and fix the plurality of light emitting devices to the display substrate. The melted bonding member is then transformed into a hardened bonding member.

It is difficult for the light emitting device to be bonded to the display substrate by pressure applied once, so the light emitting device is bonded to the display substrate by applying and releasing pressure at least several times. In this case, the light emitting device and the bonding member may be separated due to expansion due to the material characteristics of the bonding member. That is, partial separation occurs between the light emitting device and the bonding member.

As shown in FIG. 1A, it may be separated from the bonding member 2 at the step portion A formed inside the lower side of the light emitting device 4. As shown in FIG. 1B, the light emitting device 4 may be separated from the bonding member 2 at the outer edge portion B.

In particular, this separation causes various deformations and stress in the bonding member 2 depending on the equilibrium state of the display substrate, the pressed state of each of the plurality of light emitting devices 4, and the position of each of the plurality of light emitting devices 4 and making it easy for the light emitting device 4 and the bonding member 2 to be separated.

In addition, the bonding member 2 is made of a material with a high coefficient of thermal expansion, so the shrinkage and expansion are large, so there is a high possibility that volume expansion will occur due to absorption of surrounding moisture during the heat compression process. Additionally, changes in physical properties of the bonding member 2 may occur due to ultraviolet rays, etc. The area most affected by these changes in physical properties is the area where the bonding member 2 and the light emitting device 4 come into contact.

As described above, when the light emitting device 4 and the bonding member 2 are separated, the following problems occur.

First, product reliability is low due to lack of fixity. The bonding member 2 serves to fix the light emitting device 4 to the display substrate. However, when the light emitting device 4 is separated from the display substrate, the fixing force of the light emitting device 4 to the display substrate decreases. In particular, when a display device equipped with a light emitting device 4 is used for a long time, the light emitting device 4 is separated from the display substrate due to various impacts, resulting in defective pixels or defects in areas containing multiple pixels, resulting in a fatal decrease in product reliability.

In addition, poor electrical connection causes poor lighting or reduced brightness. Since the bonding member 2 has conductivity, the light emitting device 4 is electrically connected to the electrode wiring 1 through the bonding member 2. However, when the light emitting device 4 and the bonding member 2 are separated, even if the conductive ball 3 is not electrically connected to the light emitting device 4, the contact area between the light emitting device 4 and the conductive ball 3 is reduced, causing a decrease in luminance.

DISCLOSURE

Technical Problem

The embodiment aims to solve the above-mentioned problems and other problems.

Another object of the embodiment is to provide a semiconductor light emitting device with enhanced electrical connectivity between the passivation layer of the semiconductor light emitting device and the first adhesive layer.

Another object of the embodiment is to provide a semiconductor light emitting device with enhanced fixation between the passivation layer and the first adhesive layer of the semiconductor light emitting device.

Another object of the embodiment is to provide a display device with enhanced electrical connectivity between the semiconductor light emitting device and the substrate.

Another object of the embodiment is to provide a display device with enhanced fixation between the semiconductor light emitting device and the substrate.

The technical objects of the embodiments are not limited to those described in this item and include those that can be understood through the description of the invention.

Technical Solution

According to one aspect of the embodiment to achieve the above or other objects, a semiconductor light emitting device includes a light emitting layer, a passivation layer on the light emitting layer, and a first adhesive layer on the passivation layer, wherein the passivation layer may include a plurality of grooves, and the first adhesive layer may be disposed in each of the plurality of grooves.

The passivation layer may include a plurality of first medium layers and a plurality of second medium layers stacked on each other, the first medium layer may have a first refractive index, and the second medium layer may have a second refractive index different from the first refractive index.

The passivation layer may include a third medium layer, and the first medium layer and the second medium layer are disposed on the third medium layer, and the third medium layer may be in contact with the surface of the light emitting layer.

Each of the plurality of grooves may include a first groove in the first medium layer and a second groove in the second medium layer, the first groove and the second groove may have different widths.

The first adhesive layer includes a first-first adhesive layer in the first groove, and it may include a first-second adhesive layer in the second groove.

It may include a second adhesive layer on the first adhesive layer, and the first adhesive layer may include reflective particles.

The second adhesive layer may include at least one conductive ball.

The first adhesive layer may include at least one conductive ball.

According to another aspect of the embodiment, a display device may include a substrate including a plurality of pixels; electrode wiring on the substrate; an insulating layer in each of the plurality of pixels; first to third semiconductor light emitting devices on the insulating layer; and a first adhesive layer disposed between the electrode wiring and each of the first to third semiconductor light emitting devices, and electrically connecting each of the first to third semiconductor light emitting devices to the electrode wiring, and the first to third semiconductor light emitting devices include a light emitting layer and a passivation layer on the light emitting layer, the passivation layer includes a plurality of grooves, and the first adhesive layer may be disposed in each of the plurality of grooves.

The first adhesive layer may be included in each of the first to third semiconductor light emitting devices.

Each of the first to third semiconductor light emitting devices may include one of a horizontal semiconductor light emitting device, a flip chip type semiconductor light emitting device, and a vertical semiconductor light emitting device.

The substrate may include a stretchable substrate.

Advantageous Effects

The embodiment strengthens fixation and electrical connectivity, thereby preventing poor lighting or reduced brightness. Additionally, the reliability of the product may be improved.

As shown in FIGS. 7, 8, 13, and 14, a plurality of grooves 1521 may be formed in the passivation layer 1520 of the third semiconductor light emitting device 313 (the same applies to the first semiconductor light emitting device 311 and the second semiconductor light emitting device 312). The passivation layer 1520 may include a DBR layer. Each of the plurality of grooves 1521 may have, for example, a fish bone shape. The first adhesive layer 1540 may be disposed in each of the plurality of grooves 1521 of the passivation layer 1520. Accordingly, the first adhesive layer 1540 is caught and fixed in the plurality of grooves 1521 having a fish bone shape, so that the first adhesive layer 1540 may not be separated from the passivation layer 1520.

In this case, when the third semiconductor light emitting device 313 (same as the first semiconductor light emitting device 311 and the second semiconductor light emitting device 312) is mounted on the first substrate 301, each of the first to third semiconductor light emitting devices 311, 312, and 313 is more firmly fixed to the first substrate 301, thereby enhancing fixation and improving product reliability.

In addition, when the third semiconductor light emitting device 313 (same as the first semiconductor light emitting device 311 and the second semiconductor light emitting device 312) is mounted on the first substrate 301, and when the third semiconductor light emitting device 313 (same as the first semiconductor light emitting device 311 and the second semiconductor light emitting device 312) is mounted on the first substrate 301, since it is more completely connected to the first electrode wire 321 and the second electrode wire 322 on the first substrate 301, lighting defects or reduced brightness may be prevented.

Meanwhile, in the embodiment, a first adhesive layer 1540 is formed in each of the plurality of grooves 1521 of the passivation layer 1520 so that each of the first to third semiconductor light emitting devices 311, 312, and 313 is not separated from the passivation layer 1520 in advance, so that an easier and error-free process is possible, which may increase mass productivity.

In addition, the embodiment makes it possible to implement a stretchable display by dividing the display into a rigid area corresponding to each of the plurality of pixels (PX) and a soft area other than the remaining area.

In addition, the display device of the embodiment may include a horizontal semiconductor light emitting device, a flip chip type semiconductor light emitting device, or a vertical semiconductor light emitting device.

Additional scope of applicability of the embodiments will become apparent from the detailed description below. However, since various changes and modifications within the spirit and scope of the embodiments may be clearly understood by those skilled in the art, the detailed description and specific embodiments, such as preferred embodiments, should be understood as being given by way of embodiment only.

DESCRIPTION OF DRAWINGS

FIGS. 1A and 1B show the light emitting device and the bonding member being separated.

FIG. 2 shows a living room of a house where a display device according to an embodiment is placed.

FIG. 3 is a block diagram schematically showing a display device according to an embodiment.

FIG. 4 is a circuit diagram showing an example of the pixel of FIG. 3.

FIG. 5 is an enlarged view of the first panel area in the display device of FIG. 2.

FIG. 6 is a plan view showing a unit pixel of a display device according to the first embodiment.

FIG. 7 is a cross-sectional view showing a unit pixel of a display device according to the first embodiment.

FIG. 8 is a cross-sectional view showing a semiconductor light emitting device of an embodiment.

FIG. 9 is a rear view showing a semiconductor light emitting device of an embodiment.

FIGS. 10 to 12 illustrate a method of forming a plurality of grooves in a passivation layer of a semiconductor light emitting device of an embodiment.

FIG. 13 is a detailed cross-sectional view showing area C of FIG. 7.

FIG. 14 is a detailed cross-sectional view of area D in FIG. 13.

FIG. 15 is a graph showing thermal change (or viscosity change) according to temperature.

FIG. 16 is a cross-sectional view showing a display device according to a second embodiment.

FIG. 17 is a detailed cross-sectional view of area E of FIG. 16.

FIG. 18 is a cross-sectional view showing a display device according to a third embodiment.

The size, shape, and dimensions of the components shown in the drawings may be different from the actual ones. In addition, although the same components are shown in different sizes, shapes, and numbers between drawings, this is only an example in the drawings, and identical components may have the same size, shape, and numerical value between drawings.

MODE FOR INVENTION

Hereinafter, embodiments disclosed in the present specification will be described in detail with reference to the attached drawings, but identical or similar components will be assigned the same reference numbers regardless of the reference numerals, and duplicate descriptions thereof will be omitted. The suffixes 'module' and 'part' for components used in the following description are given or used interchangeably in consideration of ease of specification preparation, and do not have distinct meanings or roles in themselves. Additionally, the attached drawings are intended to facilitate easy understanding of the embodiments disclosed in this specification, and the technical idea disclosed in this specification is not limited by the attached drawings. Additionally, when an element such as a layer, region or substrate is referred to as being 'on' another component, this includes elements that may exist directly on other elements or other intermediate elements in between.

Display devices described in this specification may include TVs, shines, mobile phones, smart phones, head-up displays (HUDs) for automobiles, backlight units for laptop computers, and displays for VR or AR. etc. However, the configuration according to the embodiment described in this specification may be applied to a device capable of displaying even if it is a new product type that is developed in the future.

Hereinafter, a light emitting device according to an embodiment and a display device including the same will be described.

FIG. 2 shows a living room of a house where a display device according to an embodiment is placed.

Referring to FIG. 2, the display device 100 of the embodiment may display the status of various electronic products such as a washing machine 101, a robot vacuum cleaner 102, and an air purifier 103, and may communicate with each electronic product based on IoT and may also control each electronic product based on the user's setting data.

The display device 100 according to the embodiment may include a flexible display manufactured on a thin and flexible substrate. Flexible displays may bend or curl like paper while maintaining the characteristics of existing flat displays.

In a flexible display, visual information may be implemented by independently controlling the light emission of unit pixels arranged in a matrix form. A unit pixel refers to the minimum unit for implementing one color. A unit pixel of a flexible display may be implemented by a light emitting device. In the embodiment, the light emitting device may be Micro-LED or Nano-LED, but is not limited thereto.

FIG. 3 is a block diagram schematically showing a display device according to an embodiment, and FIG. 4 is a circuit diagram showing an example of the pixel of FIG. 3.

Referring to FIGS. 3 and 4, a display device according to an embodiment may include a display panel 10, a driving circuit 20, a scan driver 30, and a power supply circuit 50.

The display device 100 of the embodiment may drive the light emitting device in an active matrix (AM, Active Matrix) method or a passive matrix (PM, Passive Matrix) method.

The driving circuit 20 may include a data driver 21 and a timing control unit 22.

The display panel 10 may be rectangular, but there is no limitation thereto. That is, the display panel 10 may be formed in a circular or oval shape. At least one side of the display panel 10 may be bent to a predetermined curvature.

The display panel 10 may be divided into a display area (DA) and a non-display area (NDA) disposed around the display area (DA). The display area DA is an area where pixels PX are formed to display an image. The display panel 10 may include data wires (D1 to Dm, m is an integer greater than 2), scan lines (S1 to Sn, n is an integer greater than 2) that intersect the data wires (D1 to Dm), high-potential voltage line (VDDL) supplied with high-potential voltage, low-potential voltage line (VSSL) supplied with low-potential voltage, and pixels (PX) connected to data lines (D1 to Dm) and scan lines (S1 to Sn).

Each of the pixels PX may include a first sub-pixel PX1, a second sub-pixel PX2, and a third sub-pixel PX3. The first sub-pixel (PX1) may emit a first color light of a first main wavelength, the second sub-pixel PX2 may emit a second color light of a second main wavelength, and the third sub-pixel PX3 may emit a third color light of a third main wavelength. The first color light may be red light, the second color light may be green light, and the third color light may be blue light, but are not limited thereto. Additionally, in FIG. 3, it is illustrated that each of the pixels PX includes three sub-pixels, but the present invention is not limited thereto. That is, each pixel PX may include four or more sub-pixels.

Each of the first sub-pixel (PX1), the second sub-pixel (PX2), and the third sub-pixel (PX3) may be connected to at least one of the data lines D1 to Dm, at least one of the scan lines S1 to Sn, and the high potential voltage line VDDL. As shown in FIG. 4, the first sub-pixel PX1 may include light emitting devices LD, a plurality of transistors for supplying current to the light emitting devices LD, and at least one capacitor Cst.

Although not shown in the drawing, each of the first sub-pixel (PX1), the second sub-pixel (PX2), and the third sub-pixel (PX3) may include only one light emitting device (LD) and at least one capacitor (Cst).

Each of the light emitting devices LD may be a semiconductor light emitting diode including a first electrode, a plurality of conductivity-type semiconductor layers, and a second electrode. Here, the first electrode may be an anode electrode and the second electrode may be a cathode electrode, but this is not limited.

The light emitting device (LD) may be one of a horizontal light emitting device, a flip chip type light emitting device, and a vertical light emitting device.

As shown in FIG. 4, the plurality of transistors may include a driving transistor (DT) that supplies current to the light emitting devices (LD) and a scan transistor (ST) that supplies a data voltage to the gate electrode of the driving transistor (DT). The driving transistor (DT) may include a gate electrode connected to the source electrode of the scan transistor (ST), a source electrode connected to the high potential voltage line (VDDL) to which a high potential voltage is applied, and a drain electrode connected to the first electrodes of the light emitting devices (LD). The scan transistor (ST) may include a gate electrode connected to a scan line (Sk, k is an integer satisfying 1≤k≤n), a source electrode connected to the gate electrode of the driving transistor (DT) and a drain electrode connected to the data wire (Dj, j is an integer satisfying 1≤j≤m)

The capacitor Cst is formed between the gate electrode and the source electrode of the driving transistor DT. The storage capacitor (Cst) charges the difference between the gate voltage and source voltage of the driving transistor (DT).

The driving transistor (DT) and the scan transistor (ST) may be formed of a thin film transistor. In addition, in FIG. 4, the driving transistor (DT) and the scan transistor (ST) are mainly described as being formed of a P-type MOSFET (Metal Oxide Semiconductor Field Effect Transistor), but the present invention is not limited thereto. The driving transistor (DT) and scan transistor (ST) may be formed of an N-type MOSFET. In this case, the positions of the source and drain electrodes of the driving transistor (DT) and the scan transistor (ST) may be changed.

In addition, in FIG. 4, although each of the first sub-pixel (PX1), the second sub-pixel (PX2), and the third sub-pixel (PX3) are illustrated to include 2T1C (2 Transistor-1 capacitor) with one driving transistor (DT), one scan transistor (ST), and one capacitor (Cst), but the present invention is not limited to this. Each of the first sub-pixel (PX1), the second sub-pixel (PX2), and the third sub-pixel (PX3) may include a plurality of scan transistors (ST) and a plurality of capacitors (Cst).

Since the second sub-pixel (PX2) and the third sub-pixel (PX3) may be represented by substantially the same circuit diagram as the first sub-pixel (PX1), detailed descriptions thereof will be omitted.

The driving circuit 20 outputs signals and voltages for driving the display panel 10. For this purpose, the driving circuit 20 may include a data driver 21 and a timing controller 22.

The data driver 21 receives digital video data (DATA) and source control signal (DCS) from the timing control unit 22. The data driver 21 converts digital video data (DATA) into analog data voltages according to the source control signal (DCS) and supplies them to the data wires (D1 to Dm) of the display panel 10.

The timing control unit 22 receives digital video data (DATA) and timing signals from the host system. Timing signals may include a vertical sync signal, a horizontal sync signal, a data enable signal, and a dot clock. The host system may be an application processor in a smartphone or tablet PC, a monitor, or a system-on-chip in a TV.

The timing control unit 22 generates control signals to control the operation timing of the data driver 21 and the scan driver 30. The control signals may include a source control signal (DCS) for controlling the operation timing of the data driver 21 and a scan control signal (SCS) for controlling the operation timing of the scan driver 30.

The driving circuit 20 may be arranged in the non-display area (NDA) provided on one side of the display panel 10. The driving circuit 20 may be formed of an integrated circuit (IC) and mounted on the display panel 10 using a chip on glass (COG) method, a chip on plastic (COP) method, or an ultrasonic bonding method, but the present invention is not limited to this. For example, the driving circuit 20 may be mounted on a circuit board (not shown) rather than on the display panel 10.

The data driver 21 is mounted on the display panel 10 using a COG (chip on glass) method, a COP (chip on plastic) method, or an ultrasonic bonding method, and timing control unit 22 may be mounted on a circuit board.

The scan driver 30 receives a scan control signal (SCS) from the timing control unit 22. The scan driver 30 generates scan signals according to the scan control signal SCS and supplies them to the scan lines S1 to Sn of the display panel 10. The scan driver 30 may include a plurality of transistors and may be formed in the non-display area NDA of the display panel 10. Alternatively, the scan driver 30 may be formed as an integrated circuit, and in this case, it may be mounted on a gate flexible film attached to the other side of the display panel 10.

The circuit board may be attached to pads provided at one edge of the display panel 10 using an anisotropic conductive film. Because of this, the lead lines of the circuit board may be electrically connected to the pads. The circuit board may be a flexible printed circuit board, a printed circuit board, or a flexible film such as a chip on film. The circuit board may be bent toward the bottom of the display panel 10. Because of this, one side of the circuit board is attached to one edge of the display panel 10, and the other side is placed below the display panel 10 and may be connected to a system board on which the host system is mounted.

The power supply circuit 50 may generate voltages necessary for driving the display panel 10 from the main power supplied from the system board and supply them to the display panel 10. For example, the power supply circuit 50 generates a high potential voltage (VDD) and a low potential voltage (VSS) to drive the light emitting devices (LD) of the display panel 10 from the main power supply, and may supply the high potential voltage line (VDDL) and the low potential voltage line (VSSL) of the display panel 10. Additionally, the power supply circuit 50 may generate and supply driving voltages for driving the driving circuit 20 and the scan driver 30 from the main power supply.

FIG. 5 is an enlarged view of the first panel area in the display device of FIG. 3.

Referring to FIG. 5, the display device 100 of the embodiment may be manufactured by mechanically and electrically connecting a plurality of panel areas, such as the first panel area A1, by tiling.

The first panel area A1 may include a plurality of semiconductor light emitting devices 150 arranged for each unit pixel (PX in FIG. 3).

For example, the unit pixel PX may include a first sub-pixel PX1, a second sub-pixel PX2, and a third sub-pixel PX3. For example, a plurality of red semiconductor light emitting devices 150R may be disposed in the first sub-pixel PX1, a plurality of green semiconductor light emitting devices 150G may be disposed in the second sub-pixel PX2, and a plurality of blue semiconductor light emitting devices 150B may be disposed in the third sub-pixel PX3. The unit pixel PX may further include a fourth sub-pixel in which a semiconductor light emitting device is not disposed, but this is not limited.

Meanwhile, in the embodiment, the first adhesive layer is disposed in a plurality of grooves formed in the passivation layer of each of the plurality of semiconductor light emitting devices, so that the plurality of semiconductor light emitting devices and the first adhesive layer are not separated, so that fixability (or adhesion or adhesion) and electrical connectivity may be strengthened.

Descriptions omitted below may be easily understood from FIGS. 2 to 5 and the description given above in relation to the corresponding drawings.

The display device described below may be a stretchable display device, but, embodiments may be equally applied to other types of display devices, such as rigid display devices, flexible display devices, foldable display devices, and rollable display devices.

First Embodiment

FIG. 6 is a plan view showing a unit pixel of a display device according to the first embodiment.

Although a unit pixel is shown in FIG. 6, a plurality of pixels (PX) may be defined in the display device according to the first embodiment. According to the embodiment, the first to third semiconductor light emitting devices 311, 312, and 313 are disposed on the pixel PX, in addition, since the circuit portion (303 in FIG. 7) for emitting light from the first to third semiconductor light emitting devices 311, 312, and 313 is disposed, so that the area corresponding to the pixel (PX) may be called a hard area or a rigid area (RA). The area excluding the pixel PX, that is, the area between the pixels PX, is provided with only a plurality of signal wires (304 in FIG. 7) to enhance stretch ability as much as possible, so it may be called a soft area (SA). Accordingly, in the display device according to the first embodiment, all areas except for each of the plurality of pixels (PX) are soft areas (SA), each of the plurality of pixels (PX) may be implemented as a stretchable display by minimizing its components or forming it with a material with stretching properties.

Referring to FIG. 6, a plurality of signal wires 304 may be electrically connected to the pixel PX.

The pixel PX may include a first semiconductor light emitting device 311, a second semiconductor light emitting device 312, and a third semiconductor light emitting device 313. For example, the first semiconductor light emitting device 311 may include a red semiconductor light emitting device that emits red light, the second semiconductor light emitting device 312 may include a green semiconductor light emitting device that emits green light, and the third semiconductor light emitting device 313 may include a blue semiconductor light emitting device that emits blue light.

The first to third semiconductor light emitting devices 311, 312, and 313 may be formed of a semiconductor material, for example, a group IV compound or a group III-V semiconductor compound.

The signal wire 304 may include, for example, a gate wire (GL), a data wire (DL), a first driving voltage line (DVL1), and a second driving voltage line (DVL2), and more wiring may be provided.

For example, the gate wire GL, the first driving voltage line DVL1, and the second driving voltage line DVL2 may be arranged along the first direction, and the data line DL may be arranged along the second direction. For example, in the pixel PX, the data line DL may intersect each of the gate line GL, the first driving voltage line DVL1, and the second driving voltage line DVL2. In other words, the gate wire GL, the first driving voltage line DVL1, and the second driving voltage line DVL2 may be electrically connected to the pixel PX in the first direction, and the data line DL may be electrically connected to the pixel PX in the second direction.

The plurality of signal wires 304 may be formed of metal with excellent electrical conductivity. The plurality of signal wires 304 may include a plurality of layers containing different metals, but the present invention is not limited thereto. A plurality of signal wires 304 may be formed on the same layer, but there is no limitation thereto. For example, a plurality of signal wires 304 on the soft area SA may be placed on the same layer, and a plurality of signal wires 304 on the rigid area RA may be placed on different layers.

For example, one line of pixels (PX) is selected by a scan signal supplied to the gate wiring (GL), and based on the first driving voltage supplied by the first driving voltage line (DVL1) and the second driving voltage supplied by the second driving voltage line (DVL2), so that a current corresponding to the data voltage supplied to each of the data lines DL may be generated in the pixel PX for one selected line. Light having luminance corresponding to different currents generated in each pixel PX may be emitted from the first to third semiconductor light emitting devices 311, 312, and 313. Accordingly, a high-quality, full-color image may be implemented by different colors and different luminances emitted from each of the first to third semiconductor light emitting devices 311, 312, and 313.

In the display device according to the first embodiment, the plurality of signal wires 304 disposed on the soft area SA may have a curly shape. For example, the length of each of the plurality of signal wires 304 may be greater than the distance between adjacent pixels (PX). Accordingly, even if the first substrate 301 is stretched, stretching may be possible corresponding to the stretched first substrate 301.

FIG. 7 is a cross-sectional view showing a unit pixel of a display device according to the first embodiment.

Referring to FIG. 7, the display device according to the first embodiment may include a first substrate 301, a circuit unit 303, and a plurality of first to third semiconductor light emitting devices 311, 312, and 313.

The first substrate 301 is responsible for overall support of the display device, and is made of a material with stretching properties so that it may be stretched in all directions. The first substrate 301 may be made of a material that has elongation properties. For example, the first substrate 301 may be made of an elastomer such as silicon rubber such as polydimethylsiloxane (PDMS) or polyurethane (PU), but is not limited thereto.

For example, the first substrate 301 may have a thin thickness, for example, 10 μm to 1 mm, in order to enhance stretching characteristics, but this is not limited.

The circuit unit 303 may be disposed in the pixel (PX). The circuit portion 303 may be formed using a semiconductor process. The circuit unit 303 is electrically connected to a plurality of signal wires 304 and the first to third semiconductor light emitting devices 311, 312, and 313, light emission of the first to third semiconductor light emitting devices 311, 312, and 313 may be controlled using signals supplied through the plurality of signal wires 304. For example, the circuit unit 303 may include at least two transistors and at least one capacitor. For example, the transistor may include a scan transistor (ST in FIG. 4) and a driving transistor (DT in FIG. 4), or may include more transistors.

According to the embodiment, the first to third semiconductor light emitting devices 311, 312, and 313 are disposed on the circuit unit 303, so that the size of the pixel PX may be minimized.

Although the circuit portion 303 is shown briefly, the top layer of the circuit portion 303 may be an insulating layer (not shown), first to third semiconductor light emitting devices 311, 312, and 313 may be disposed on this insulating layer. The circuit unit is electrically connected to the lower side of each of the first to third semiconductor light emitting devices 311, 312, and 313 through an insulating layer, or may be electrically connected to the upper side of each of the first to third semiconductor light emitting devices 311, 312, and 313, or may be electrically connected to the lower and upper sides of each of the first to third semiconductor light emitting devices 311, 312, and 313.

The insulating layer, which is the uppermost layer of the circuit portion 303, may be a planarization layer with a flat top surface to easily form the first electrode wiring 321 and the second electrode wiring 322, but this is not limited.

The display device according to the first embodiment may include a first insulating layer 306 disposed on the circuit portion 303.

The first insulating layer 306 may be formed of an inorganic material or an organic material. The first insulating layer 306 may be formed only in the pixel PX. That is, in order to enhance stretchable characteristics as much as possible, the first insulating layer 306 may be formed in the rigid area RA and not in the soft area SA.

For example, the first to third semiconductor light emitting devices 311, 312, and 313 may be sequentially inserted into the first insulating layer 306 or may be inserted simultaneously.

As an example, a liquid insulating member is formed on the circuit portion 303, and the first to third semiconductor light emitting devices 311, 312, and 313 are pressurized, so that the first to third semiconductor light emitting devices 311, 312, and 313 may be inserted into the insulating member. Thereafter, the liquid insulating member may be hardened to become a solid insulating member.

As another example, an insulating layer with grooves (or holes) corresponding to each of the first to third semiconductor light emitting devices 311, 312, and 313 is formed on the circuit portion 303, the first to third semiconductor light emitting devices 311, 312, and 313 may be inserted and fixed into each groove of the insulating layer. For example, the first to third semiconductor light emitting devices 311, 312, and 313 may be inserted into each groove of the insulating layer using a self-assembly method using a magnetic field and dielectrophoretic force from a magnet.

The first to third semiconductor light emitting devices 311, 312, and 313 may be inserted into the first insulating layer 306 using various other methods.

The first to third semiconductor light emitting devices 311, 312, and 313 are surrounded by a first insulating layer 306, by the first insulating layer 306 surrounded in this way, the first to third semiconductor light emitting devices 311, 312, and 313 may be spaced apart from each other or color mixing of light between them may be prevented. To this end, the first insulating layer 306 may be formed of a light blocking material that blocks light, but this is not limited.

The display device according to the first embodiment may include a pair of first electrode wires 321 and second electrode wires 322 disposed on the circuit unit 303.

When the first to third semiconductor light emitting devices 311, 312, and 313 are inserted into the first insulating layer 306, the lower sides of each of the first to third semiconductor light emitting devices 311, 312, and 313 may be electrically connected to the first electrode wiring 321 and the second electrode wiring 322. For example, the first electrode wire 321 may be electrically connected to the first driving voltage line DVL1, and the second electrode wire 322 may be electrically connected to the second driving voltage line DVL2.

As an example, the first electrode wiring 321 and the first driving voltage line DVL1 may be formed integrally with each other, and the second electrode wiring 322 may be formed integrally with the second driving voltage line DVL2. As another example, the first electrode and the first driving voltage line DVL1 may be formed of different metals, and the second electrode wiring 322 and the second driving voltage line DVL2 may be formed of different metals.

The display device according to the first embodiment may include a first adhesive layer 1540.

The first adhesive layer 1540 may be disposed between each of the first to third semiconductor light emitting devices 311, 312, and 313 and the circuit portion 303.

The first adhesive layer 1540 may be responsible for electrical connection and fixation of each of the first to third semiconductor light emitting devices 311, 312, and 313.

As an example, the first adhesive layer 1540 may electrically connect each of the first to third semiconductor light emitting devices 311, 312, and 313 to the first electrode wiring 321 and the second electrode wiring 322. For example, the first adhesive layer 1540 may be disposed between each of the first to third semiconductor light emitting devices 311, 312, and 313 and the first electrode wiring 321 and the second electrode wiring 322.

The first adhesive layer 1540 may be conductive. To this end, the first adhesive layer 1540 may include conductive balls 1541 or conductive particles. The upper side of the conductive ball 1541 may be in contact with the lower side of each of the first to third semiconductor light emitting devices 311, 312, and 313. The lower side of the conductive ball 1541 may be in contact with the first electrode wire 321 or the second electrode wire 322. For example, the conductive ball 1541 may be disposed only on the first electrode wire 321 and the second electrode wire 322. For example, the conductive ball 1541 may be disposed between the first electrode wire 321 and the second electrode wire 322. The conductive balls 1541 may not contact each other along the horizontal direction. Therefore, even if the conductive ball 1541 is disposed between the first electrode wire 321 and the second electrode wire 322, the conductive ball 1541 prevents the first electrode wire 321 and the second electrode wire 322 from being electrically short-circuited.

As another example, the first adhesive layer 1540 may fix each of the first to third semiconductor light emitting devices 311, 312, and 313 to the first electrode wiring 321, the second electrode wiring 322, and/or the circuit portion 303. To this end, the first adhesive layer 1540 may include an adhesive material having insulating properties.

As will be explained later, the first adhesive layer 1540 may be included in each of the first to third semiconductor light emitting devices 311, 312, and 313, but this is not limited.

The display device according to the first embodiment may include a second substrate 302. The second substrate 302 may be formed of a rigid material. For example, the second substrate 302 may be made of polyimide (PI), polyacrylate, polyacetate, etc.

For example, the first substrate 301 may be named a flexible substrate, a stretched substrate, a soft substrate, or a stretchable substrate, and the second substrate 302 may be named a rigid substrate or a rigid substrate.

The second substrate 302 may be formed in the rigid area RA corresponding to the pixel PX, and may not be formed in the soft area SA. The second substrate 302 may serve to support the circuit unit 303 and the first to third semiconductor light emitting devices 311, 312, and 313.

If the first substrate 301 sufficiently performs a supporting role, the first substrate 301 may be omitted, and the circuit portion 303 may be formed on the first substrate 301.

The display device according to the first embodiment may include a second insulating layer 307. The second insulating layer 307 may be formed of an organic material, but is not limited thereto. The second insulating layer 307 may be formed of a material having elongation properties.

The second insulating layer 307 may be disposed on the first substrate 301. The second insulating layer 307 may be disposed on the plurality of first to third semiconductor light emitting devices 311, 312, and 313.

The second insulating layer 307 may protect the first to third semiconductor light emitting devices 311, 312, and 313, the circuit unit 303, and/or the signal line from the external environment. That is, the second insulating layer 307 prevents the first to third semiconductor light emitting devices 311, 312, and 313 from being exposed to moisture, heat, etc., and may protect them from external shock. Additionally, the second insulating layer 307 may prevent signal lines from being corroded by moisture.

The second insulating layer 307 may be called a substrate, a molding part, a molding member, etc.

The semiconductor light emitting device 313 of the embodiment will be described below. For convenience of explanation, the third semiconductor light emitting device 313 is shown in FIGS. 8 and 9, but since each of the first semiconductor light emitting device 311 and the second semiconductor light emitting device 312 has the same structure and/or shape as the third semiconductor light emitting device 313, so that may be easily understood from the third semiconductor light emitting device 313 shown in FIG. 9.

FIG. 8 is a cross-sectional view showing a semiconductor light emitting device of an embodiment. FIG. 9 is a rear view showing a semiconductor light emitting device of an embodiment.

Referring to FIGS. 8 and 9, the third semiconductor light emitting device 313 of the embodiment may include a light emitting layer 1510, a passivation layer 1520, and a first adhesive layer 1540. The passivation layer 1520 may be called a protective layer, an insulating layer, etc.

The light emitting layer 1510 may include a first conductivity type semiconductor layer 1511, an active layer 1512, and a second conductivity type semiconductor layer 1513. The first conductivity-type semiconductor layer 1511, the active layer 1512, and the second conductivity-type semiconductor layer 1513 may be sequentially grown on a wafer (411 in FIG. 16) using deposition equipment such as MOCVD.

The first conductivity type semiconductor layer 1511 may include a first conductivity type dopant, and the second conductivity type semiconductor layer 1513 may include a second conductivity type dopant. For example, the first conductivity type dopant may be an n-type dopant such as silicon (Si), and the second conductivity type dopant may be a p-type dopant such as boron (B).

The passivation layer 1520 may protect the light emitting layer 1510. The passivation layer 1520 may prevent leakage current from flowing on the side of the light emitting layer 1510. The passivation layer 1520 may be formed of an insulating material, such as SiOx or SiNx, but is not limited thereto.

For example, after the light emitting layer 1510 is grown using MOCVD equipment, the second conductivity-type semiconductor layer 1513, the active layer 1512, and the first conductivity-type semiconductor layer 1511 may be etched in that order using an etching process. Afterwards, the remaining area excluding a part of the side of the first conductivity-type semiconductor layer 1511, that is, a passivation layer 1520 may be formed along another part of the side surface of the first conductivity-type semiconductor layer 1511, the side surface of the active layer 1512, and the side surface of the second conductivity-type semiconductor layer 1513.

According to an embodiment, the passivation layer 1520 may include a plurality of grooves 1521. Additionally, the passivation layer 1520 may include a DBR layer, as shown in FIG. 14, but is not limited thereto.

For example, the passivation layer 1520 may include a plurality of first medium layers 1521a and 1521b and a plurality of second medium layers 1522a and 1522b stacked on top of each other. The first medium layers 1521a and 1521b may have a first refractive index, and the second medium layers 1522a and 1522b may have a second refractive index that is different from the first refractive index.

Additionally, the passivation layer 1520 may include a third medium layer 15230. The third medium layer 15230 may be disposed on the light emitting layer 1510, a plurality of first medium layers 1521a and 1521b and a plurality of second medium layers 1522a and 1522b may be disposed on the third medium layer 15230. That is, the third medium layer 15230 may be disposed between the light emitting layer 1510 and the first medium layers 1521a and 1521b or between the light emitting layer 1510 and the second medium layers 1522a and 1522b. For example, the third medium layer 15230 may contact the surface of the light emitting layer 1510. For example, the third medium layer 15230 may surround the light emitting layer 1510.

The third medium layer 15230 prevents the light emitting layer 1510 from being exposed to the plurality of grooves 1521, the light emitting layer 1510 may be prevented from contacting the conductive balls 1541 of the first adhesive layer 1540 disposed in the plurality of grooves 1521.

The first medium layers 1521a and 1521b, the second medium layers 1522a and 1522b, and the third medium layer 15230 may be made of an inorganic material with insulating properties. Each of the first medium layers 1521a and 1521b, the second medium layers 1522a and 1522b, and the third medium layer 15230 may include at least one selected from, for example, SiOx, SiNx, TiOx, AlxOy, etc. For example, the third medium layer 15230 may include the same material or a different material from the first medium layer 1521a, 1521b or the second medium layer 1522a, 1522b.

For example, the plurality of grooves 1521 may be formed in the first medium layer (1521a, 1521b) and the second medium layer 1522a, 1522b, but may not be formed in the third medium layer 15230. To this end, the third medium layer 15230 may be a stopper layer made of a material that does not react with the etchant for wet etching used to form the plurality of grooves 1521.

A method of forming a plurality of grooves 1521 in the passivation layer 1520 will be described with reference to FIGS. 10 to 12.

As shown in FIG. 10, a third medium layer 15230 may be formed on the light emitting layer 1510, a plurality of first medium layers 1521a, 1521b, and 1521c and a plurality of second medium layers 1522a, 1522b, and 1522c may be formed alternately on the third medium layer 15230. Thereafter, a mask layer may be formed on the uppermost layer, for example, the first medium layers 1521a, 1521b, and 1521c, and then patterned to form the mask layer 1600.

As shown in FIG. 11, wet etching may be performed using an etchant for wet etching. At this time, the first medium layers 1521a, 1521b, 1521c and the second medium layers 1522a, 1522b, 1522c may have different selectivities toward the etchant for wet etching. For example, the second medium layers 1522a, 1522b, and 1522c may be better etched with a wet etching etchant than the first medium layers 1521a, 1521b, and 1521c. Meanwhile, the third medium layer 15230 may be a stopper layer that does not react with the etchant for wet etching.

Therefore, as shown in FIG. 12, a plurality of grooves 1521 may be formed by removing from the first medium layer 1521a exposed between the patterns of the mask layer 1600 by the etchant for wet etching, the second medium layer 1522a, the first medium layer 1521b, the second medium layer 1522b, the first medium layer 1521c, and the second medium layer 1522c in that order. Because the second medium layers 1522a, 1522b, 1522c have higher selectivity for the etchant for wet etching than the first medium layers 1521a, 1521b, 1521c, the second medium layer is easier to remove, the width of the groove formed in the second medium layers 1522a, 1522b, and 1522c, that is, the second groove, may be larger than the width of the groove formed in the first medium layer 1521a, 1521b, and 1521c.

As another example, the first medium layers 1521a, 1521b, 1521c and the second medium layers 1522a, 1522b, 1522c may have the same selectivity to the etchant for wet etching. In this case, the width of each groove of the first medium layers 1521a, 1521b, and 1521c and the second medium layers 1522a, 1522b, and 1522c may be the same or similar.

Meanwhile, since the exposure time to the etchant for wet etching is different depending on the location of each of the first medium layers 1521a, 1521b, 1521c and the second medium layers 1522a, 1522b, 1522c, so that the positions of the plurality of grooves 1521 may be different depending on the vertical position of the passivation layer 1520. For example, the groove 1521 on the upper side of the passivation layer 1520 exposed to the etchant for wet etching for a long time may be relatively large, and the groove 1521 on the lower side of the passivation layer 1520, which is less exposed to the etchant for wet etching, may be relatively small. In other words, the width may decrease linearly from the top to the bottom of the passivation, but this is not limited.

In the above description, the plurality of grooves 1521 are formed using wet etching, but the plurality of grooves 1521 may also be formed using dry etching. When dry etching is used, each of the plurality of grooves 1521 may be formed along a vertical direction. The widths of the grooves 1521 of the first medium layers 1521a, 1521b, and 1521c and the second medium layers 1522a, 1522b, and 1522c may be the same or similar to each other.

Meanwhile, the third semiconductor light emitting device 313 of the embodiment may include a first electrode 1531 and a second electrode 1532. The first electrode 1531 and the second electrode 1532 may allow a current corresponding to the data voltage to flow through the light emitting layer 1510. To this end, as shown in FIG. 7, the first electrode 1531 may be electrically connected to the first electrode wire 321, and the second electrode 1532 may be electrically connected to the second electrode wire 322.

According to the embodiment, the third semiconductor light emitting device 313 (same as the first semiconductor light emitting device 311 and the second semiconductor light emitting device 312) may be a flip-chip type semiconductor light emitting device or a horizontal semiconductor light emitting device in which the first electrode 1531 and the second electrode 1532 are arranged toward the same direction.

Meanwhile, the first adhesive layer 1540 may bond the third semiconductor light emitting device 313 to the circuit portion 303 or the first electrode wiring 321 and the second electrode wiring 322, as described above. That is, the first adhesive layer 1540 may electrically connect the third semiconductor light emitting device 313 to the first electrode wiring 321 and the second electrode wiring 322 and physically process it.

To this end, the first adhesive layer 1540 may be formed of an adhesive material. Additionally, the first adhesive layer 1540 may include a conductive ball 1541. For example, the first adhesive layer 1540 may be formed using an anisotropic conductive film (ACF) or anisotropic conductive paste (ACP).

ACF or ACP may be formed of an insulating resin material. As the insulating resin binder, a heat-polymerizable composition, a light-polymerizable composition, a light-heat co-polymerizable composition, etc. may be appropriately selected and used.

Examples of the thermally polymerizable composition include a thermally radically polymerizable resin composition containing an acrylate compound and a thermal radical polymerization initiator, a thermal cation polymerizable resin composition comprising an epoxy compound and a thermal cation polymerization initiator, and a thermally anionically polymerizable resin composition containing an epoxy compound and a thermal anionic polymerization initiator. Examples of the photopolymerizable composition include a radically photopolymerizable resin composition containing an acrylate compound and a radical photopolymerization initiator.

The photopolymerization initiator may contain multiple types that react to light of different wavelengths. As a result, the wavelength used for photocuring the resin constituting the insulating resin layer in the production of ACF or ACP and photocuring the resin for adhering electronic components to each other during anisotropic connection may be used separately.

When forming an insulating resin binder using a photopolymerizable composition,

By photocuring during the production of ACF or ACP, all or part of the photopolymerizable compound contained in the insulating resin binder may be photocured. By this photocuring, the arrangement of the conductive balls in the insulating resin binder is maintained or fixed, and short circuit suppression may be improved. Moreover, by adjusting the conditions of this photocuring, the viscosity of the insulating resin layer in the manufacturing process of ACF or ACP may be adjusted.

According to the embodiment, the first adhesive layer 1540 may be included in the third semiconductor light emitting device 313. That is, the first adhesive layer 1540 may be formed on the passivation layer 1520.

Method of forming the first adhesive layer 1540 on the passivation layer 1520 may use ACF or ACP containing conductive balls 1541 or use differences in curing due to UV irradiation of nPAC (negative photo active compound).

When using ACF or ACP, a B-stage film is used, and the viscosity decreases at a certain temperature, but when the temperature rises, the viscosity increases rapidly and hardens. B-stage usually refers to a pre-hardening state, and as shown in FIG. 15, it is characterized by a rapid change in shape at a specific temperature Tg (change transition point). In the case of B-stage materials such as ACF, the viscosity decreases as the temperature increases, and when the temperature rises above a certain temperature Tg, the viscosity rises rapidly and the material hardens.

Therefore, when the temperature increases and the viscosity decreases, the first adhesive layer 1540 may melt and penetrate or be inserted into the plurality of grooves 1521 of the passivation layer 1520. Thereafter, as the temperature rises above the specific temperature Tg, the viscosity also increases and the first adhesive layer 1540 may be hardened. For example, the first adhesive layer 1540 is in a semi-cured state, and the conductive ball 1541 in the first adhesive layer 1540 may be moved by pressure.

The first adhesive layer 1540 may be disposed not only on the passivation layer 1520 but also in the plurality of grooves 1521. In particular, the plurality of grooves 1521 have different widths in the first medium layers (1521*a*, 1521*b*) and the second medium layers (1522*a*, 1522*b*), in this way, the first adhesive layer 1540 is formed in the groove 1521 of each of the first medium layers 1521*a* and 1521*b* and the second medium layers 1522*a* and 1522*b* having different widths, so that the first adhesive layer 1540 may be firmly fixed to the passivation.

That is, since each of the plurality of grooves 1521 has a fish bone shape, the first adhesive layer 1540 is caught and fixed by each of the plurality of grooves 1521 of the passivation layer 1520, since the first adhesive layer 1540 is not separated from the passivation layer 1520, fixation between the third semiconductor light emitting device 313 (same as the first semiconductor light emitting device 311 and the second semiconductor light emitting device 312) and the first substrate 301 may be improved.

In addition, since the first adhesive layer 1540 is not separated from the passivation layer 1520, the third semiconductor light emitting device 313 (same as the first semiconductor light emitting device 311 and the second semiconductor light emitting device 312) is electrically connected to the first wiring and the second wiring without disconnection by the first adhesive layer 1540, so that it is possible to prevent poor lighting or a decrease in luminance of the first to third semiconductor light emitting devices 311, 312, and 313.

Meanwhile, as shown in FIGS. 13 and 14, the third semiconductor light emitting device 313 may be bonded to the first electrode wire 321 and the second electrode wire 322 on the first substrate 301 via the first adhesive layer 1540.

The first insulating layer 306 may be disposed on the circuit portion 303. The first insulating layer 306 may be an adhesive material that melts with heat, but is not limited thereto.

After the first electrode 1531 and the second electrode 1532 of the third semiconductor light emitting device 313 (same as the first semiconductor light emitting device 311 and the second semiconductor light emitting device 312) are positioned to face the first electrode wire 321 and the second electrode wire 322 on the first substrate 301, by applying heat to melt the first insulating layer 306, and applying pressure to the third semiconductor light emitting device 313, the third semiconductor light emitting device 313 may be brought into close contact with the first electrode wiring 321 and the second electrode wiring 322. That is, the third semiconductor light emitting device 313 may be in close contact with the first electrode wiring 321 and the second electrode wiring 322 through the first insulating layer 306. As the first insulating layer 306 is hardened in this close contact state, the third semiconductor light emitting device 313 may be fixed within the first insulating layer 306. By pressing the first adhesive layer 1540 between the light emitting layer 1510 and the first electrode wiring 321 and the second electrode wiring 322, the upper side of the conductive ball 1541 in the first adhesive layer 1540 is in contact with the first electrode 1531 or the second electrode 1532 of the semiconductor light emitting device, the lower side of the conductive ball 1541 in the first adhesive layer 1540 may be in contact with the first electrode wire 321 or the second electrode wire 322. For example, when the first insulating layer 306 is cured, the first adhesive layer 1540 is also cured, so that the conductive ball 1541 may be maintained in contact with the first electrode 1531 or the second electrode 1532 and the first electrode wire 321 or the second electrode wire 322 of the semiconductor light emitting device.

Meanwhile, a first insulating layer 306 is disposed between the first adhesive layer 1540 and the first electrode wiring 321 and the second electrode wiring 322, a conductive ball 1541 may be located in this first insulating layer 306. That is, by simultaneously positioning the conductive balls 1541 on different members, the fixation of the conductive balls 1541 is strengthened and the force to expand the conductive balls 1541 may be suppressed. For example, part of the conductive ball 1541 may be fixed to the first adhesive layer 1540, and another part of the conductive ball 1541 may be fixed to the first insulating layer 306.

In another embodiment, the first insulating layer 306 may not be disposed between the third semiconductor light emitting device 313 and the circuit portion 303, but may be disposed only around the third semiconductor light emitting device 313, but there is no limited to this.

In FIG. 14, two first medium layers (1521*a*, 1521*b*) and two second medium layers (1522*a*, 1522*b*) are shown, but as shown in FIG. 12, it may have three first medium layers (1521*a*, 1521*b*, 1521*c*) and two second medium layers (1522*a*, 1522*b*, 1522*c*) or more first and second medium layers.

As shown in FIG. 14, each of the plurality of grooves 1521 may include a first groove 1521_1 formed in each of the plurality of first medium layers 1521*a* and 1521*b* and a second groove 1521_2 formed in each of the plurality of second medium layers 1522*a* and 1522*b*. The first width W1 of the first groove 1521_1 and the second width W2 of the second groove 1521_2 may be different, but this is not limited. For example, the second width W2 of the second groove 1521_2 may be larger than the first width W1 of the first groove 1521_1.

The first adhesive layer 1540 may include a first-first adhesive layer 1540_1, a first-second adhesive layer 1540_2, and a first-third adhesive layer 1540_3. For example, the first-first adhesive layer 1540_1 may be disposed in the first groove 1521_1, the first-second adhesive layer 1540_2 may be disposed in the second groove 1521_2, and the first-third adhesive layer 1540_3 may be disposed on the passivation layer 1520.

Since the second width (W2) of the second groove 1521_2 is larger than the first width (W1) of the first groove 1521_1, the width of the first-second adhesive layer 1540_2 may also be larger than the width of the first-first adhesive layer 1540_1. In this case, the first-second adhesive layer 1540_2 has a first region and a second region, the first area may vertically contact the first-first adhesive layer 1540_1, and the second area may vertically overlap a portion of the first medium layers 1521a and 1521b. For example, the first area of the first-second adhesive layer 1540_2 may be an area extending upward or downward from the first-first adhesive layer 1540_1. For example, the second region of the first-second adhesive layer 1540_2 extends in both directions from the first region and may vertically contact the lower or upper surfaces of the first medium layers 1521a and 1521b. Meanwhile, the side surface of the first-first adhesive layer 1540_1 may be in contact with the side surface of the first medium layers 1521a and 1521b.

Meanwhile, in the above description, the first adhesive layer 1540 is included in each of the first to third semiconductor light emitting devices 311, 312, and 313, but the first adhesive layer 1540 may be provided independently of each of the first to third semiconductor light emitting devices 311, 312, and 313.

Specifically, when performing a bonding process, the first adhesive layer 1540 may be attached to each of the first to third semiconductor light emitting devices 311, 312, and 313. At this time, the first adhesive layer 1540 is in the form of a film or sheet with an adhesive material applied to one side, and may be attached to each of the first to third semiconductor light emitting devices 311, 312, and 313 through the adhesive material. Thereafter, the first to third semiconductor light emitting devices 311, 312, and 313 to which the first adhesive layer 1540 is attached may be positioned in each sub-pixel of each of the plurality of pixels (PX) on the first insulating layer 306. Thereafter, the first adhesive layer 1540 and the first insulating layer 306 are melted by thermal compression, each of the first to third semiconductor light emitting devices 311, 312, and 313 may be in close contact with the first electrode wiring 321 and the second electrode wiring 322 through the first insulating layer 306. At this time, the conductive ball 1541 of the first adhesive layer 1540 is also pressed, it may be in contact with the first electrode 1531 or the second electrode 1532 and the first electrode wiring 321 or the second electrode wiring 322 of the first to third semiconductor light emitting devices 311, 312, and 313. Afterwards, the curing process is performed, so that the first adhesive layer 1540 and the first insulating layer 306 are cured, the conductive ball 1541 may also maintain contact and electrical connection between the semiconductor light emitting device and the first electrode wiring 321 and the second electrode wiring 322.

Second Embodiment

FIG. 16 is a cross-sectional view showing a display device according to a second embodiment. FIG. 17 is a detailed cross-sectional view showing area E of FIG. 16.

The second embodiment is the same as the first embodiment except for the second adhesive layer 1550 and the reflective particles 1543. In the second embodiment, the same reference numerals are assigned to those having the same shape, structure, and/or function as those of the first embodiment, and detailed descriptions are omitted.

As shown in FIGS. 16 and 17, a third semiconductor light emitting device 313 (same as the first semiconductor light emitting device 311 and the second semiconductor light emitting device 312) is disposed in the first insulating layer 306, the first adhesive layer 1540 and the second adhesive layer 1550 may be disposed between the third semiconductor light emitting device 313 and the first and second electrode wires 321 and 322.

The first adhesive layer 1540 may be disposed on the passivation layer 1520 of the third semiconductor light emitting device 313. For example, it may be disposed not only on the surface of the passivation layer 1520 but also in the plurality of grooves 1521.

Since each of the plurality of grooves 1521 has a fish bone shape, the first adhesive layer 1540 is locked by each of the plurality of grooves 1521 of the passivation layer 1520, since the first adhesive layer 1540 is not separated from the passivation layer 1520, fixation between the third semiconductor light emitting device 313 (same as the first semiconductor light emitting device 311 and the second semiconductor light emitting device 312) and the first substrate 301 may be improved.

Additionally, since the first adhesive layer 1540 is not separated from the passivation layer 1520, the third semiconductor light emitting device 313 (same as the first semiconductor light emitting device 311 and the second semiconductor light emitting device 312) is electrically connected to the first wiring and the second wiring without disconnection by the first adhesive layer 1540, so that poor lighting or decrease in luminance of the first to third semiconductor light emitting devices 311, 312, and 313 may be prevented.

The first adhesive layer 1540 may include reflective particles 1543. That is, the reflective particles 1543 may be dispersed on the first adhesive layer 1540. The reflective particles 1543 may be made of metal. Reflecting particles 1543 may be called scattering particles, light diffusing particles, light extracting particles, etc. Therefore, the light traveling downward from the third semiconductor light emitting device 313 is reflected upward or in a random direction by the reflective particles 1543 of the first adhesive layer 1540, so that brightness may be improved by emitting more light to the front.

The second adhesive layer 1550 may be disposed on the first adhesive layer 1540. The second adhesive layer 1550 may be disposed between the first adhesive layer 1540 and the first electrode wire 321 and the second electrode wire 322. The second adhesive layer 1550 may include a conductive ball 1541. The third semiconductor light emitting device 313 and the first electrode wire 321 and the second electrode wire 322 may be electrically connected to each other by the conductive ball 1541 of the second adhesive layer 1550. In addition, the semiconductor light emitting device may be physically fixed to the circuit portion 303 and/or the first electrode wiring 321 and the second electrode wiring 322 by the first adhesive layer 1540 and the second adhesive layer 1550.

In FIG. 16, the lower surface of the first adhesive layer 1540 is shown as being in contact with the first electrode wire 321 and the second electrode wire 322, but a first insulating layer 306 may be disposed between the first adhesive layer 1540 and the first and second electrode wires 321 and 322.

Third Embodiment

FIG. 18 is a cross-sectional view showing a display device according to a third embodiment.

The third embodiment is the same as the first and/or second embodiments except that the third semiconductor light emitting device 313 (same as the first semiconductor light emitting device 311 and the second semiconductor light emitting device 312) is a vertical semiconductor light emitting device and the electrical connection with the electrode wiring. In the third embodiment, the same reference numerals are assigned to those having the same shape, structure, and/or function as those of the first embodiment and/or the second embodiment, and detailed descriptions are omitted.

As shown in FIG. 18, the third semiconductor light emitting device 313 may be a vertical semiconductor light emitting device. Voltage is supplied to the upper and lower sides of the vertical semiconductor light emitting device, so that current may flow along the vertical direction of the vertical semiconductor light emitting device. In FIG. 18, the side of the third semiconductor light emitting device 313 is shown as having a surface perpendicular to the horizontal plane, but this is not limited.

The lower side of the third semiconductor light emitting device 313, that is, the electrode 1530, is electrically connected to the first electrode wiring 323, the upper side of the third semiconductor light emitting device 313 may be electrically connected to the second electrode wiring 324. For example, the second electrode wire 324 may be electrically connected to the upper side of the third semiconductor light emitting device 313 through the side and top surfaces of the first insulating layer 306, but is not limited to this.

If the display device according to the third embodiment is not a stretchable display device, another insulating layer is disposed on the third semiconductor light emitting device 313, and the second electrode wire 324 may be electrically connected to the upper side of the third semiconductor light emitting device 313 through a contact hole formed in another insulating layer.

Meanwhile, the first adhesive layer 1540 may be disposed between the third semiconductor light emitting device 313 and the first electrode wiring 323. At least a portion of the first adhesive layer 1540 may be disposed in a plurality of grooves 1521 formed in the passivation layer 1520 of the third semiconductor light emitting device 313.

Since each of the plurality of grooves 1521 has a fish bone shape, the first adhesive layer 1540 is caught and fixed by each of the plurality of grooves 1521 of the passivation layer 1520, the first adhesive layer 1540 is not separated from the passivation layer 1520, and a fixation between the third semiconductor light emitting device 313 (same as the first semiconductor light emitting device 311 and the second semiconductor light emitting device 312) and the first substrate 301 may be improved.

In addition, since the first adhesive layer 1540 is not separated from the passivation layer 1520, the third semiconductor light emitting device 313 (same as the first semiconductor light emitting device 311 and the second semiconductor light emitting device 312) is electrically connected to the first wiring and the second wiring without disconnection by the first adhesive layer 1540, so that poor lighting or decrease in luminance of the first to third semiconductor light emitting devices 311, 312, and 313 may be prevented.

The above detailed description should not be construed as restrictive in any respect and should be considered illustrative. The scope of the embodiments should be determined by reasonable interpretation of the appended claims, and all changes within the equivalent scope of the embodiments are included in the scope of the embodiments.

INDUSTRIAL APPLICABILITY

The embodiment may be adopted in the field of displays that display images or information.

The embodiment may be adopted in the field of displays that display images or information using semiconductor light emitting devices. The semiconductor light emitting device may be a micro-level semiconductor light emitting device or a nano-level semiconductor light emitting device.

The invention claimed is:

1. A semiconductor light emitting device comprising:
a light emitting layer;
a passivation layer on the light emitting layer;
a first electrode and a second electrode spaced from each other on the light emitting layer; and
a first adhesive layer on the passivation layer, the first electrode and the second electrode,
wherein the passivation layer comprises
a plurality of grooves;
a plurality of first medium layers;
a plurality of second medium layers stacked on the plurality of first medium layers; and
a third medium layer,
wherein the first adhesive layer is disposed in each of the plurality of grooves,
wherein each first medium layer has a first refractive index,
wherein each second medium layer has a second refractive index different from the first refractive index,
wherein each first medium layer and each second medium layer are disposed on the third medium layer,
wherein the third medium layer is in contact with a surface of the light emitting layer,
wherein each of the plurality of grooves comprises a first groove in each first medium layer and a second groove in each second medium layer, and
wherein the first groove and the second groove have different widths.

2. The semiconductor light emitting device according to claim 1, wherein the passivation layer further comprises a distributed Bragg reflector (DBR) layer.

3. The semiconductor light emitting device according to claim 1, wherein a second width of the second groove is greater than a first width of the first groove.

4. The semiconductor light emitting device according to claim 3, wherein the first adhesive layer comprises a first-first adhesive layer in the first groove and a first-second adhesive layer in the second groove.

5. The semiconductor light emitting device according to claim 4, wherein the first adhesive layer further comprises a first-third adhesive layer on the passivation layer.

6. The semiconductor light emitting device according to claim 4, wherein a first region of the first-second adhesive layer is in vertical contact with the first-first adhesive layer, and
wherein a second region of the first-second adhesive layer vertically overlaps a portion of each first medium layer.

7. The semiconductor light emitting device according to claim 1, further comprising a second adhesive layer on the first adhesive layer, and
wherein the first adhesive layer comprises a reflective particle.

8. The semiconductor light emitting device according to claim 7, wherein the second adhesive layer comprises at least one conductive ball.

9. A semiconductor light emitting device comprising:
a light emitting layer;
a passivation layer on the light emitting layer,
a first electrode and a second electrode spaced from each other on the light emitting layer; and
a first adhesive layer on the passivation layer, the first electrode and the second electrode,
wherein the passivation layer comprises
a plurality of grooves;
a plurality of first medium layers;
a plurality of second medium layers stacked on the plurality of first medium layers; and
a third medium layer,
wherein the first adhesive layer is disposed in each of the plurality of grooves,
wherein each first medium layer has a first refractive index,
wherein each second medium layer has a second refractive index different from the first refractive index
wherein each first medium layer and each second medium layer are disposed on the third medium layer,
wherein the third medium layer is in contact with a surface of the light emitting layer, and
wherein the first adhesive layer comprises at least one conductive ball.

10. The semiconductor light emitting device according to claim 1, wherein the first adhesive layer is disposed on a side surface and a top surface of each of the first electrode and the second electrode.

11. A semiconductor light emitting device comprising:
a light emitting layer;
a passivation layer on the light emitting layer;
a first electrode and a second electrode spaced from each other on the light emitting layer; and
a first adhesive layer on the passivation layer, the first electrode and the second electrode,
wherein the passivation layer comprises
a plurality of grooves;
a plurality of first medium layers;
a plurality of second medium layers stacked on the plurality of first medium layers; and
a third medium layer,
wherein the first adhesive layer is disposed in each of the plurality of grooves,
wherein each first medium layer has a first refractive index,
wherein each second medium layer has a second refractive index different from the first refractive index,
wherein each first medium layer and each second medium layer are disposed on the third medium layer,
wherein the third medium layer is in contact with a surface of the light emitting layer, and wherein the plurality of grooves of the passivation layer are not overlapped with the first electrode and the second electrode.

12. The semiconductor light emitting device according to claim 1, further comprising a mask layer on the plurality of first medium layers, the plurality of second medium layers stacked on the plurality of first medium layers, and the third medium layer.

13. The semiconductor light emitting device according to claim 12, wherein the mask layer includes a plurality of cut outs exposing an upper surface of one of the plurality of first medium layers.

14. The semiconductor light emitting device according to claim 1, wherein the first electrode has a longer length than a length of the second electrode in a horizontal direction.

15. The semiconductor light emitting device according to claim 14, wherein a height of the second electrode is greater than a height of the first electrode in a vertical direction.

16. The semiconductor light emitting device according to claim 1, wherein the second electrode includes a protrusion portion that protrudes through the passivation layer.

* * * * *